United States Patent
Aoki et al.

(10) Patent No.: US 9,881,769 B2
(45) Date of Patent: Jan. 30, 2018

(54) CHARGED PARTICLE BEAM DEVICE AND CHARGED PARTICLE BEAM DEVICE CONTROL METHOD

(71) Applicant: Hitachi High-Technologies Corporation, Minato-ku, Tokyo (JP)

(72) Inventors: Kenji Aoki, Tokyo (JP); Tsutomu Saitou, Tokyo (JP); Kotaro Hosoya, Tokyo (JP); Mitsuhiro Nakamura, Tokyo (JP); Kunji Shigeto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/023,456

(22) PCT Filed: Oct. 7, 2014

(86) PCT No.: PCT/JP2014/076799
§ 371 (c)(1),
(2) Date: Mar. 21, 2016

(87) PCT Pub. No.: WO2015/053262
PCT Pub. Date: Apr. 16, 2015

(65) Prior Publication Data
US 2016/0203947 A1    Jul. 14, 2016

(30) Foreign Application Priority Data

Oct. 8, 2013   (JP) ................................. 2013-211223

(51) Int. Cl.
*H01J 37/28*   (2006.01)
*H01J 37/29*   (2006.01)
(Continued)

(52) U.S. Cl.
CPC .......... *H01J 37/292* (2013.01); *H01J 37/073* (2013.01); *H01J 37/244* (2013.01); *H01J 37/28* (2013.01);
(Continued)

(58) Field of Classification Search
CPC ............... H01J 37/28; H01J 2237/2003; H01J 2237/18; H01J 2237/24465; H01J 2237/2809; H01J 37/244
See application file for complete search history.

(56) References Cited

U.S. PATENT DOCUMENTS 4,897,545 A * 1/1990 Danilatos .............. H01J 37/244
                                                              250/310
5,644,132 A * 7/1997 Litman ................. H01J 37/244
                                                              250/310
(Continued)

FOREIGN PATENT DOCUMENTS

JP        7-65775 A       3/1995
JP       07065775 A  *    3/1995
(Continued)

OTHER PUBLICATIONS

International Search Report (PCT/ISA/210) issued in PCT Application No. PCT/JP2014/076799 dated Dec. 16, 2014 with English translation (five pages).
(Continued)

*Primary Examiner* — Wyatt Stoffa
(74) *Attorney, Agent, or Firm* — Crowell & Moring LLP

(57) ABSTRACT

The objective of the present invention is to provide a charged particle beam device, wherein the positional relationship between reflected electron detection elements and a sample and the vacuum state of the sample surroundings are evaluated to select automatically a reflected electron detection element appropriate for acquiring an intended image. In
(Continued)

this charged particle beam device, all the reflected electron detection elements are selected when the degree of vacuum inside the sample chamber is high and the sample is distant from the reflected electron detectors, while a reflected electron detection element appropriate for acquiring a compositional image or a height map image is selected when the degree of vacuum inside the sample chamber is high and the sample is close to the reflected electron detectors. When the degree of vacuum inside the sample chamber is low, all the reflected electron detection elements are selected.

16 Claims, 8 Drawing Sheets

(51) Int. Cl.
*H01J 37/073* (2006.01)
*H01J 37/244* (2006.01)

(52) U.S. Cl.
CPC . *H01J 2237/18* (2013.01); *H01J 2237/24465* (2013.01); *H01J 2237/24475* (2013.01); *H01J 2237/2809* (2013.01)

(56) References Cited

U.S. PATENT DOCUMENTS

| 7,462,839 | B2* | 12/2008 | Gnauck | H01J 37/244 250/310 |
| 8,629,395 | B2* | 1/2014 | Morishita | H01J 37/244 250/305 |
| 2005/0173644 | A1* | 8/2005 | Gnauck | H01J 37/244 250/370.11 |
| 2010/0140470 | A1* | 6/2010 | Shachal | H01J 37/20 250/307 |
| 2011/0284745 | A1* | 11/2011 | Nishiyama | G01N 23/2204 250/307 |
| 2012/0104250 | A1* | 5/2012 | Bean | G02B 21/367 250/307 |
| 2012/0241608 | A1* | 9/2012 | Shachal | H01J 37/20 250/307 |
| 2012/0298864 | A1 | 11/2012 | Morishita et al. | |
| 2013/0032713 | A1* | 2/2013 | Barbi | H01J 37/26 250/307 |
| 2014/0021347 | A1* | 1/2014 | Ominami | H01J 37/18 250/307 |
| 2014/0042316 | A1* | 2/2014 | Barbi | G01T 1/2018 250/307 |
| 2015/0014529 | A1* | 1/2015 | Nanri | H01J 37/244 250/310 |
| 2016/0155606 | A1* | 6/2016 | Shachal | H01J 37/20 250/307 |

FOREIGN PATENT DOCUMENTS

| JP | 2002-42711 A | 2/2002 |
| JP | 2012-238400 A | 12/2012 |
| JP | 2013-182760 A | 9/2013 |
| WO | WO 2011/089955 A1 | 7/2011 |
| WO | WO 2013/065399 A1 | 5/2013 |

OTHER PUBLICATIONS

Japanese-language Written Opinion (PCT/ISA/237) issued in PCT Application No. PCT/JP2014/076799 dated Dec. 16, 2014 (three pages).

* cited by examiner (a) AREA 400

(b) AREA 401+AREA 404

(d) AREA 401+AREA 402

(c) AREA 403+AREA 404

(e) AREA 402+AREA 403

CHARGED PARTICLE BEAM DEVICE AND CHARGED PARTICLE BEAM DEVICE CONTROL METHOD

TECHNICAL FIELD

The present invention relates to a charged particle beam device.

BACKGROUND ART

A charged particle beam device, such as a scanning electron microscope, detects, using a charged particle detector, a secondary charged particle released by irradiating a primary charged particle beam to a sample. In turn, by associating the irradiation position of the primary charged particle beam with the detected signal, the charged particle beam device can acquire an observation image of the sample at a high magnification.

Secondary charged particle can be roughly divided into two types: secondary electron and reflected electron. A certain type of scanning electron microscope includes a reflected electron detector that is disposed between an objective lens and a sample and detects a reflected electron. A reflected electron detector includes a reflected electron detection element that detects a reflected electron.

A charged particle beam device disclosed in PLT 1 includes at least two annular reflected electron detection elements, each of which includes a reflected electron detection unit that has a separate amplifier. According to PLT 1, a compositional image is acquired by selecting, from among the reflected electron detection elements included in the reflected electron detection unit, a reflected electron detection element disposed on the inner circumference side. Also, an unevenness image is acquired by selecting a detection element disposed on the outer circumference side.

CITATION LIST

Patent Literature

PLT 1: JP Patent Publication (Kokai) H07-065775 (1995)

SUMMARY OF INVENTION

Technical Problem

The present inventors conducted extensive research on acquisition of an intended image by a reflected electron detector and acquired the following knowledge:

In the charged particle beam device of PLT 1 to appropriately acquire a compositional image and an unevenness image, the most appropriate reflected electron detection element needs to be selected and used. This selection and use require assessment of the size and shape of the reflected electron detection element, the positional relationship between a sample and the reflected electron detection element, and the vacuum state of the area surrounding the sample.

However, it is difficult for an operator of the charged particle beam device to select the most appropriate reflected electron detection element considering the size and shape of the reflected electron detection element included in the charged particle beam device, the positional relationship between a sample and the reflected electron detection element, and the vacuum state of the area around the sample. As the number of separate elements increases, selection becomes more difficult. To determine which reflected electron detection element needs to be selected in order to acquire an intended image, an operator has to repeat the process of selecting a reflected electron detection element, changing the positional relationship between the reflected electron detection element and a sample, and changing the vacuum state of the area surrounding the sample. Repeating such a process on a trial-and-error basis requires a large amount of time and is impractical.

The present invention is made in view of the aforementioned problem. An object of the present invention is to provide a charged particle beam device that recognizes the positional relationship between the reflected electron detection element and a sample as well as the vacuum state of the area surrounding the sample in order to automatically select a reflected electron detection element appropriate for acquiring an intended image.

Solution to Problem

A charged particle beam device according to the present invention selects all of the reflected electron detection elements when the degree of vacuum inside a sample chamber is high and the sample is far away from the reflected electron detector. When the degree of vacuum inside the sample chamber is high and the sample is close to the reflected electron detector, the aforementioned charged particle beam device selects a reflected electron detection element that is suitable for acquiring a compositional image or unevenness image. When the degree of vacuum inside the sample chamber is low, the aforementioned charged particle beam device selects all of the reflected electron detection elements.

Advantageous Effects of Invention

The charged particle beam device according to the present invention can readily acquire an intended image even when an operator does not consider the size and shape of a reflected electron detection element, the positional relationship between a sample and the reflected electron detection element, and the vacuum state of the area surrounding the sample.

DESCRIPTION OF EMBODIMENTS

First Embodiment

Figure 1:
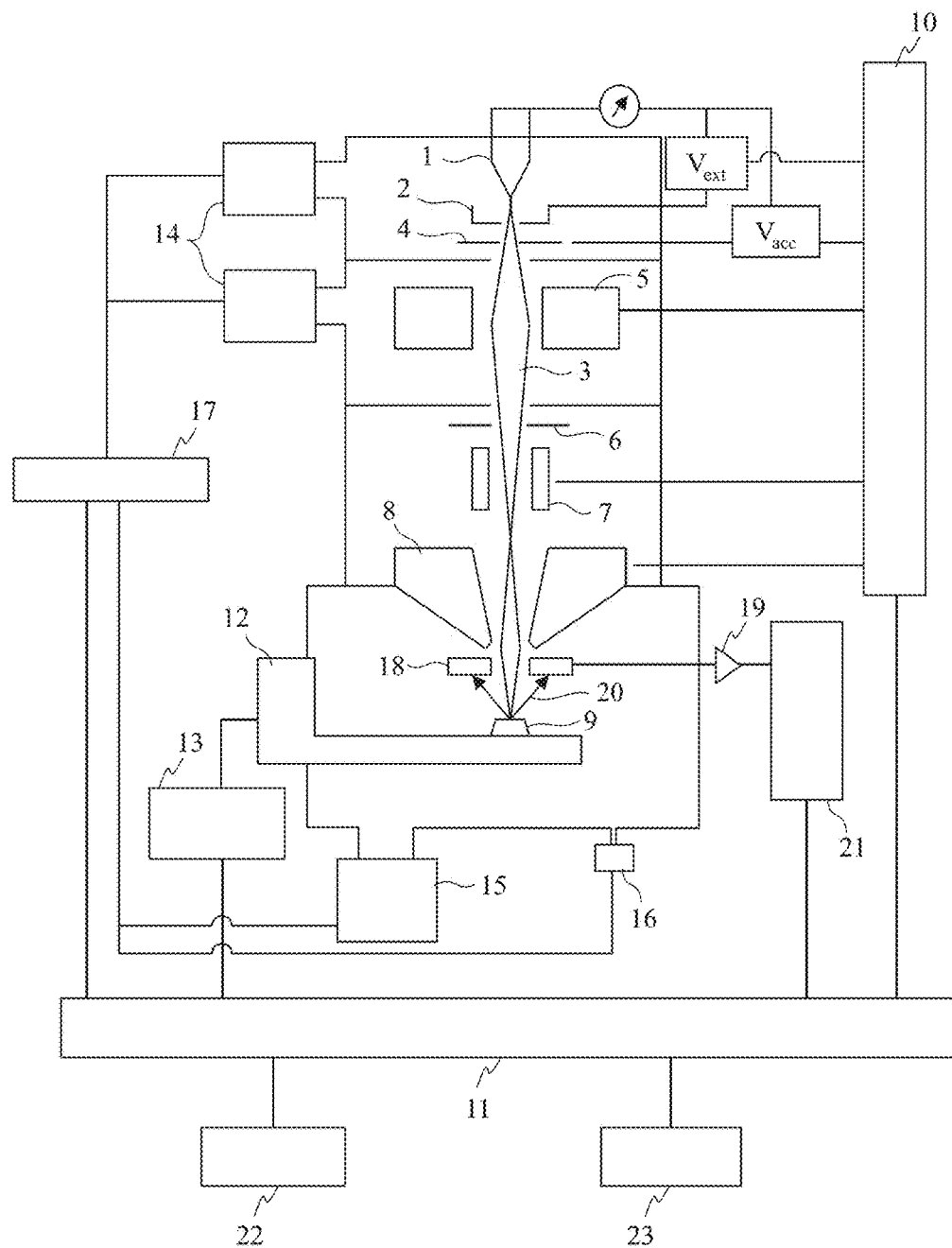
FIG. 1 is a side view illustrating an overall configuration of a charged particle beam device according to a first embodiment.

FIG. 1 is a side view illustrating an overall configuration of the charged particle beam device according to the first embodiment of the present invention. As an example charged particle, a scanning electron microscope mounted with a Field-emission Electron Gun (FEG) is hereinafter illustrated. However, a charged particle beam device and electron gun may be of a different type. For example, usable charged particle beam device types include Scanning Transmission Electron Microscope (STEM). Usable electron gun types include not only FEG but also Schottky-type electron gun, thermal (thermally assisted) field-emission electron gun, and thermionic-emission electron gun.

An electron beam 3 is released by an extraction voltage Vext applied between a cathode 1 and a first anode 2. The electron beam 3 is further accelerated by an acceleration voltage Vacc applied to a second anode 4 and proceed to a downstream electromagnetic lens system. The lens system has a conversion lens 5, an objective aperture 6, a deflection coil 7, and an objective lens 8. The accelerated electron beam 3 is controlled to be at a predetermined current by at least one conversion lens 5 and at least one objective aperture 6. The deflection coil 7 is used to scan the electron beam 3 on the sample 9. The objective lens 8 is controlled so as to allow the electron beam 3 to converge on the sample 9. An electron beam control circuit 10 controls the lens system in the process from generation of the electron beam 3 to irradiation of the sample. The electron beam control circuit 10 is controlled by a computer 11.

A sample moving device 12 has a mechanism for mechanically moving the sample 9 and an operation motor. The operation motor is controlled by a sample movement control circuit 13. The sample movement control circuit 13 is controlled by the computer 11. The sample moving device 12 has five operation axes: X and Y axes for plane movement of the sample 9, a Z axis for changing the height, a T axis for inclination, and an R axis for rotation.

The area surrounding the cathode 1 needs to be kept at an ultra-high vacuum state of below $1 \times 10^{-8}$ Pa so as to extract an electron beam 3 by field emission. The degree of vacuum of the area surrounding the sample 9 is normally $1 \times 10^{-3}$ Pa or below. However, use at several 100 Pa eventually takes place in order to restrain electrification of the sample 9. The scanning electron microscope is configured to have rooms with a small hole through which the electron beam 3 passes, wherein each room is exhausted by a different pump, in order to maintain the exhaust gas pressure difference between the cathode 1 and the sample 9. The atmosphere of the cathode 1 is exhausted by a getter pump 14. In a scanning electron microscope, to maintain the exhaust gas pressure difference between the cathode 1 and the sample 9, a plurality of getter pump 14 are often used. The atmosphere of the area surrounding the sample 9 is normally exhausted by a turbo molecular pump 15. The back pressure of the turbo molecular pump 15 is exhausted by an unillustrated rotary pump. A leak valve 16 is disposed in a room where the sample 9 is disposed. The leak valve 16 can bring a small amount of air to the room where the sample 9 is disposed in order to keep the room surrounding the sample 9 between several Pa and several hundreds of Pa, which is referred to as a low vacuum state. An exhaust control circuit 17 controls the aforementioned pumps and valves. The exhaust control circuit 17 is controlled by the computer 11.

The reflected electron detector 18 has at least two separated reflected electron detection elements. The reflected electron detection elements are each connected to a separate amplifier 19. The reflected electron detection element detects a reflected electron 20 generated from the sample 9. The amplifier 19 is connected to a signal control circuit 21. The signal control circuit 21 controls, by control of the computer 11, selection of the amplifier 19 and the amplification amount.

The computer 11 is connected to the display device 22 and an input device 23. The computer 11 controls the electron beam control circuit 10, the sample movement control circuit 13, the exhaust control circuit 17, and the signal control circuit 21. In addition, the computer 11 uses a detection signal of the reflected electron 20 to generate an observation image of the sample 9. The input device 23 accepts an operator input. The display device 22 displays information on the status of the charged particle beam device and the observation image of the sample 9.

Figure 2:
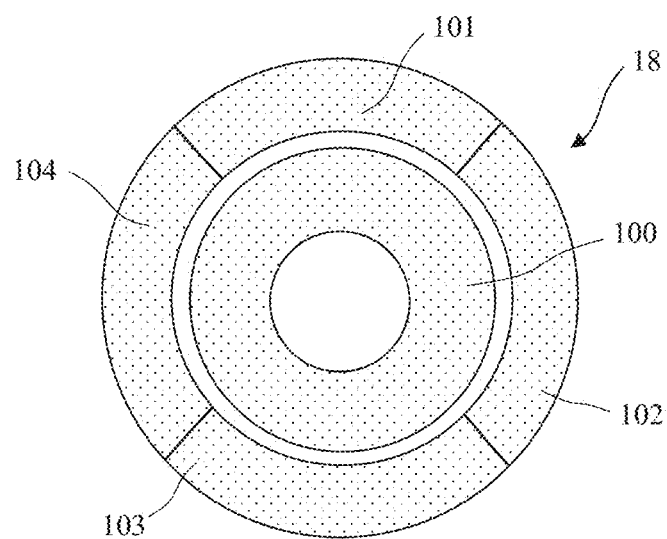
FIG. 2 is a plan diagram illustrating a reflected electron detector 18 seen from directly below.

FIG. 2 is a plan diagram illustrating the reflected electron detector 18 seen from directly below. The reflected electron detector 18 has reflected electron detection elements 100, 101, 102, 103, 104. The reflected electron detection element 100 has an annular shape. The reflected electron detection elements 101 to 104 are all fan-shaped. When these four elements are connected, the connected elements have an annular shape. A concentric ring of the reflected electron detection element 100 is disposed on the inner circumference side. A concentric ring of the reflected electron detection elements 101 to 104 is disposed on the outer circumference side. A hole through which the electron beam 3 passes is formed at the center of the circular ring.

Figure 3:
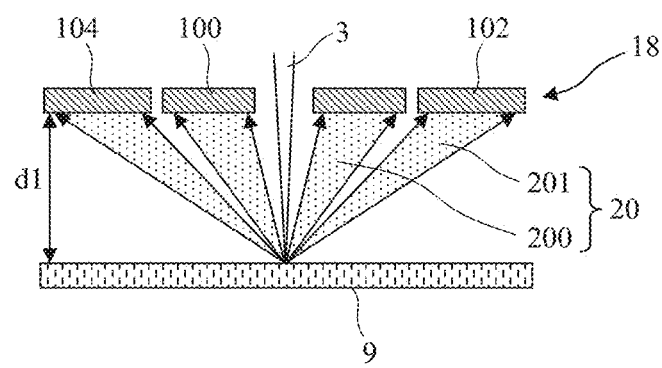
FIG. 3 is a side view illustrating a positional relationship between the reflected electron detector 18 and a sample 9.

FIG. 3 is a side view illustrating the positional relationship between the reflected electron detector 18 and the sample 9. The reflected electron 20 is generated by irradiating the electron beam 3 to the sample 9. The reflectivity of the reflected electron 20 tends to increase with an increase in the atomic number of the substance and with a decrease in the irradiation surface angle with respect to the electron beam 3. Due to this tendency, when a large-angle reflected electron 200, which is reflected in the direction of and in close proximity to the electron beam 3, is used to generate an observation image of the sample 9, a compositional image where the unevenness is restrained and the atomic number difference is represented by the contrast is generated. When a small-angle reflected electron 201, which is reflected in the direction of and far away from the electron beam 3, is used to generate an observation image of the sample 9, an unevenness image where the unevenness of the sample 9 is represented by the contract is generated. Even when the small-angle reflected electron 201 is acquired in all directions, an unevenness image is generated. For example, however, when only the reflected electron detection element 102, which is one of the separate reflected electron detection elements 101, 102, 103, or 104 on the outer circumference, is used to generate an observation image of the sample 9, an image where the unevenness of the sample is particularly emphasized is generated.

In FIG. 3, d1 denotes the distance between the sample 9 and the reflected electron detector 18 along the irradiation axis of the electron beam 3. In the state illustrated in FIG. 3, the distance d1 is short. Even when each reflected electron detection element is used alone, an observation image can be acquired by detecting the reflected electron 20 in a sufficient amount.

Figure 4:
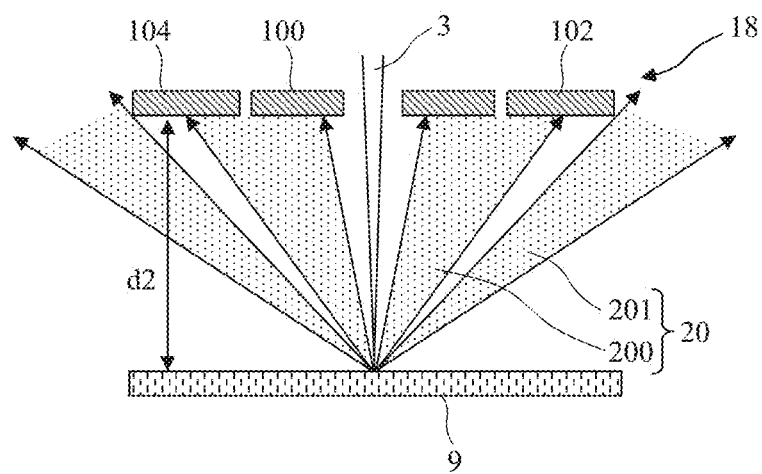
FIG. 4 is a side view illustrating a positional relationship between the reflected electron detector 18 and the sample 9 where the distance therebetween is longer.

FIG. 4 is a side view illustrating the positional relationship between the reflected electron detector 18 and the sample 9 where the distance therebetween is longer. d2 denotes the distance between the sample 9 and the reflected electron detector 18 along the irradiation axis of the electron beam 3. In FIG. 4, the only type of the reflected electron 20 that reaches the reflected electron detector 18 is the large-angle reflected electron 200. The reflected electron detector 18 cannot detect the low-angle reflected electron 201. To acquire an observation image of the sample 9, all of the reflected electron detection elements 100 to 104 need to be used.

The area surrounding the sample 9 is normally in a high vacuum state of $1\times10^{-3}$ Pa or below or a low vacuum state of several Pa to several hundreds of Pa. In a high vacuum state, the chance of the reflected electron 20 colliding a gas molecule is very low. Most of the generated reflected electrons 20 either reach a reflected electron detection element or collide an inner wall in a chamber. In a low vacuum state, the chance of the reflected electron 20 colliding a gas molecule is high, and the number of reflected electrons reaching a reflected electron detection element decreases. Even when the distance between the sample 9 and the reflected electron detector 18 is sufficiently short, all of the reflected electron detection elements need to be used to acquire an observation image. The atmospheric pressure of the area surrounding the sample 9 can be measured using a pressure meter that measures the atmospheric pressure inside the sample chamber.

An operator cannot normally know the specifics of the size and shape of each reflected electron detection element as well as the distance between the sample 9 and the reflected electron detector 18. To acquire an intended image using the reflected electron detector 18 with a plurality of reflected electron detection elements, an attempt to search the most appropriate element selection condition can be made by repeatedly selecting a reflected electron detection element and changing the distance between the sample 9 and the reflected electron detector 18. However, making such a selection and change requires a large amount of time. Some types of the samples 9 tend to be deteriorated by an influence of the electron beam 3, and the most appropriate element selection condition cannot be in some cases searched many times for such types of samples. According to the first embodiment, a scanning electron microscope recognizes its own condition and automatically selects a reflected electron detection element to assist an operator.

Figure 5:
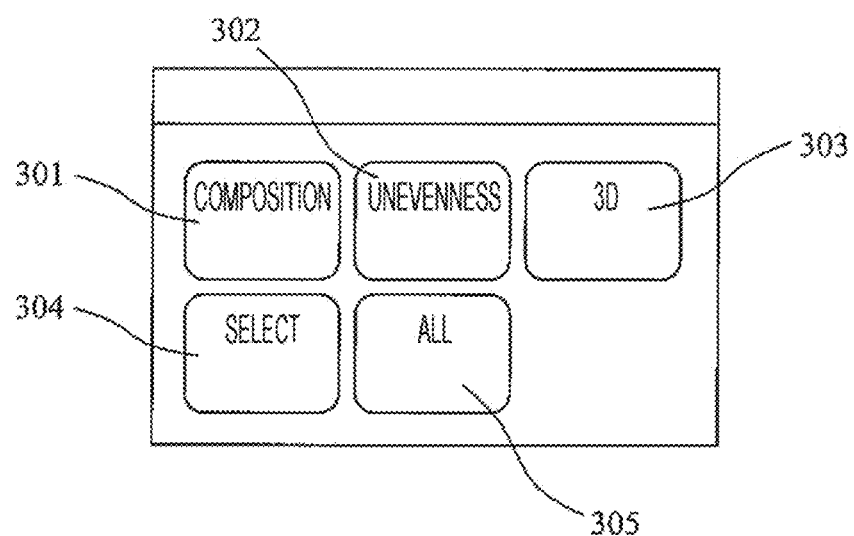
FIG. 5 is a diagram illustrating one example of a user interface (UI) for selecting an image acquisition condition displayed on a display device 22.

FIG. 5 is a diagram illustrating one example of a user interface (UI) for selecting an image acquisition condition displayed on the display device 22. The UI illustrated in FIG. 5 has a composition button 301, an unevenness button 302, a 3D button 303, a selection button 304, and an all button 305. The composition button 301 is a button for instructing acquisition of a compositional image. The unevenness button 302 is a button for instructing acquisition of an unevenness image. The 3D button 303 is a button for instructing acquisition of an image where unevenness is emphasized using one of the reflected electron detection elements 101 to 104. The selection button 304 is a button for instructing selection of a reflected electron detection element by an operator. The all button 305 is a button for instructing selection of all of the reflected electron detection elements. When an operator presses all of these buttons, the computer 11 activates the charged particle beam device at the specified operation mode. In this example, there are five buttons, but a button for a new operation mode can be added depending on the shape and size of the reflected electron detection elements as well as on how these elements are separated.

Figure 6A:
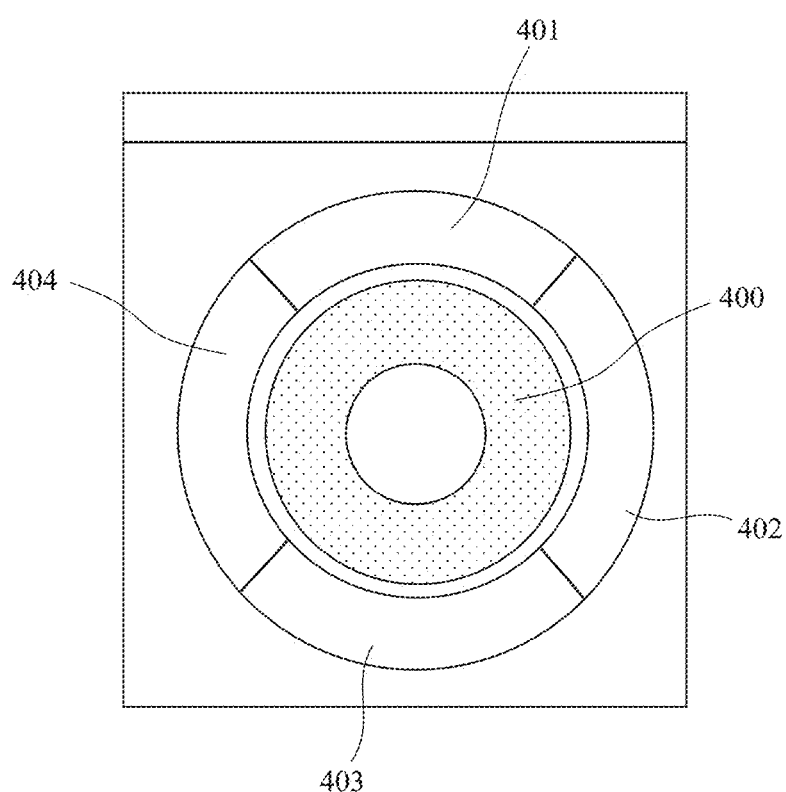
FIG. 6A is a diagram illustrating one example of the UI displayed on the display device 22 when a selection button 304 is pressed.

FIG. 6A is a diagram illustrating one example of the UI displayed on the display device 22 when the selection button 304 is pressed. An area 400 corresponds to the reflected electron detection element 100. Areas 401 to 404 correspond, respectively, to the reflected electron detection elements 101 to 104. The four fan-shaped areas 401 to 404 are connected and disposed on the upper, lower, left, and right sides of the concentric area 400. By selecting one of the areas, an operator can select a reflected electron detection element to be used. The reflected electron detection element 100 is selected in FIG. 6. By virtues of this UI, an operator can visually recognize which reflected electron detection element is selected.

Figure 6B:
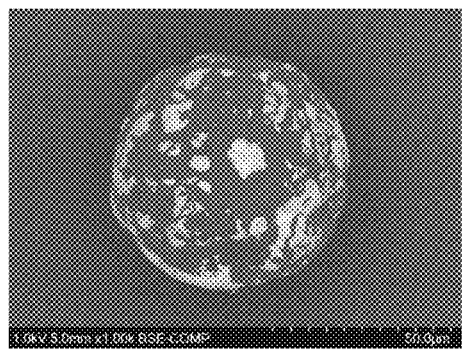
FIG. 6B is a diagram illustrating one example image when each of areas 400 to 404 is pressed.
Figure 6B:
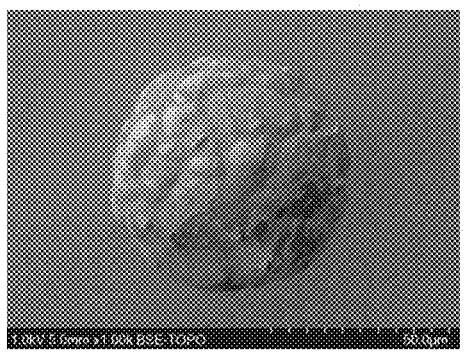
Figure 6B:
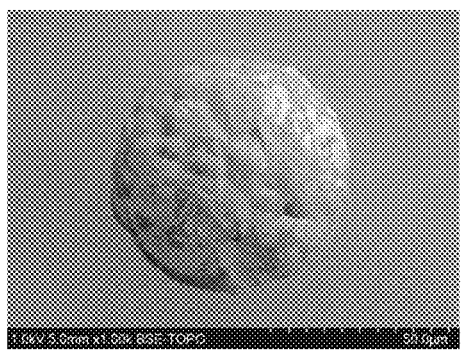
Figure 6B:
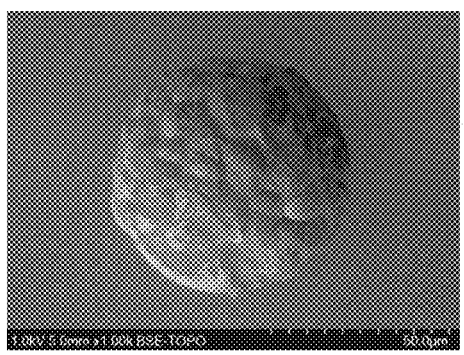
Figure 6B:
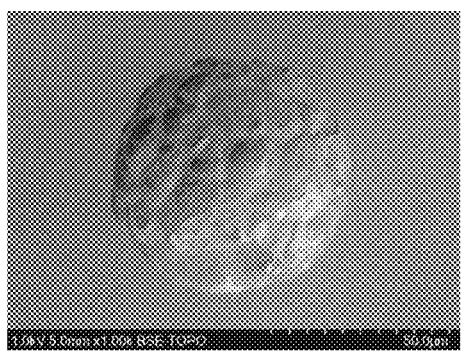

FIG. 6B is a diagram illustrating an observation image and the UI displayed on the display device 22 when the areas 400 to 404 are pressed. Laser printer toner is used as one example of a sample. (a) illustrates the situation where the reflected electron detection element 100 is selected. The fact that the reflected electron detection element 100 is selected can be visually recognized from the display of the area 400. The observation image is a compositional image where the unevenness is restrained and the atomic number difference is expressed by the contrast. (b) illustrates the situation where the reflected electron detection elements 101 and 104 are selected. The fact that the reflected electron detection elements 101 and 104 are selected can be visually recognized from the areas 401 and 404. The observation image is an unevenness image where the unevenness of the sample is expressed by the contrast as if irradiated by light from the directions of the areas 401 and 404. As in the case of (b), (c) illustrates the situation where the reflected electron detection elements 103 and 104 are selected. (d) illustrates the situation where the reflected electron detection elements 101 and 102 are selected. (e) illustrates the situation where the reflected electron detection elements 102 and 103 are selected.

The UI illustrated in FIG. 6 is useful for an experience operator familiar with the specifications of the charged particle beam device. In the following example, it is assumed that an experienced operator wishes to acquire an image in which a small-volume unevenness image is contained in a compositional image. To acquire a compositional image first, the operator confirms the reflected electron detection element to be used for acquiring the compositional image. Subsequently, the operator selects, e.g., the reflected electron detection element 101 that is disposed far away from the electron beam 3 in order to acquire an observation image. The operator thereby quickly acquires the intended image.

Figure 7:
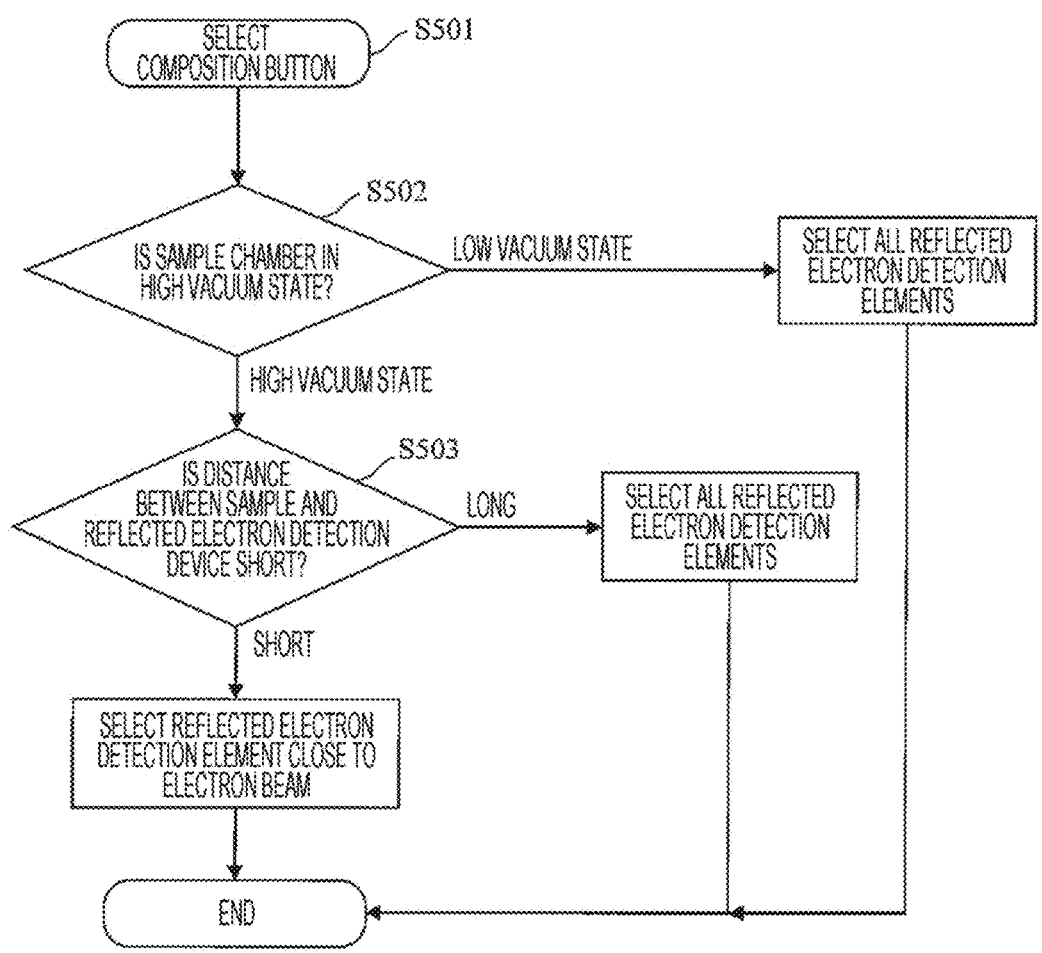
FIG. 7 is an operation flow of a charged particle beam device when a composition button 301 is pressed.

FIG. 7 is an operation flow of the charged particle beam device when the composition button 301 is pressed. The computer 11 recognizes the pressing of the composition button 301 in step S501 when the composition button 301 is pressed. In step S502, the computer 11 confirms the degree of vacuum of the area surrounding the sample 9. In a low vacuum state (e.g., when the atmospheric pressure inside the sample chamber is greater than several Pa), the signal control circuit 21 selects all of the reflected electron detection elements. In a high vacuum state (e.g., when the atmospheric pressure inside the sample chamber is smaller than Pa 1×10⁻³ Pa), the operation flow proceeds to step S503. In step S503, the computer 11 confirms the distance between the sample 9 and the reflected electron detector 18 along the irradiation axis of the electron beam 3. When the distance is long (FIG. 4), the signal control circuit 21 selects all of the reflected electron detection elements. When the distance is short (FIG. 3), the signal control circuit 21 selects the reflected electron detection element disposed close to the electron beam 3.

Figure 8:
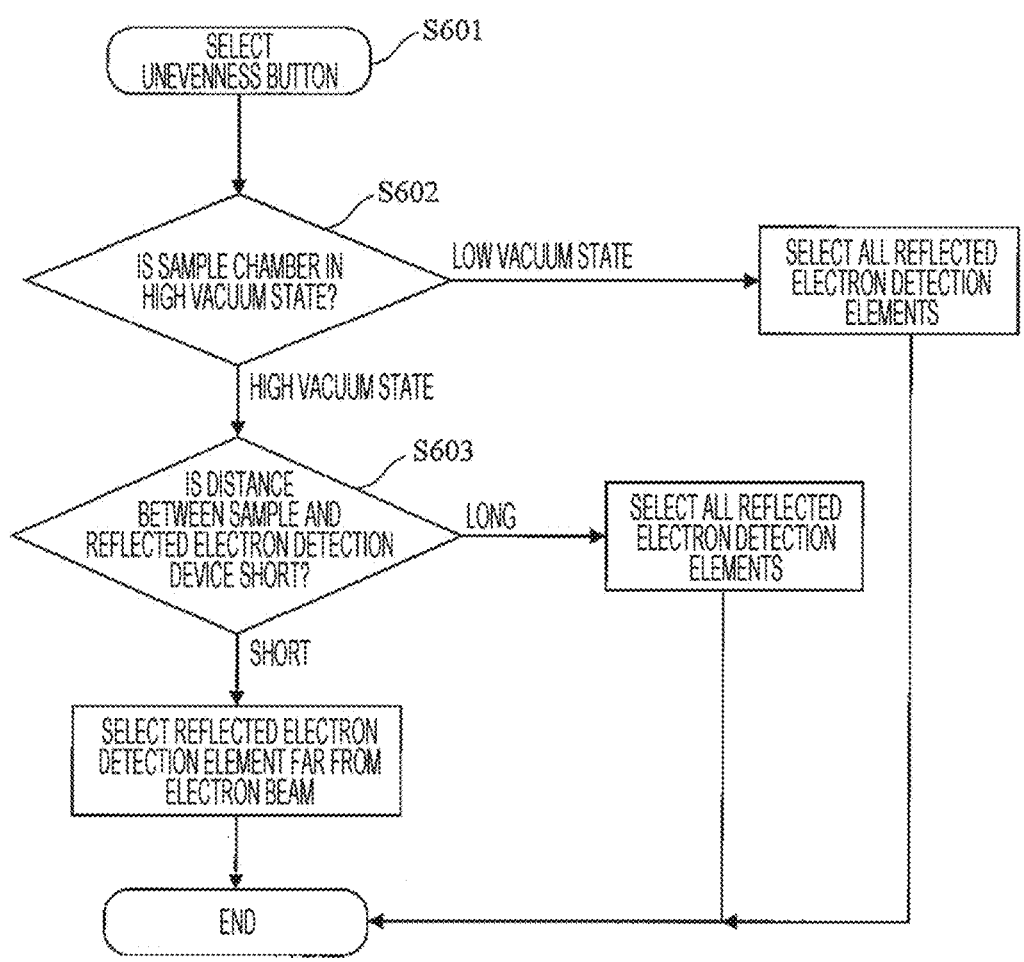
FIG. 8 is an operation flow of a charged particle beam device when an unevenness button 302 is pressed.

FIG. 8 is an operation flow of the charged particle beam device when the unevenness button 302 is pressed. The computer 11 recognizes the pressing of the unevenness button 302 when the unevenness button 302 is pressed in step S601. In step S602, the computer 11 confirms the degree of vacuum of the area surrounding the sample 9. In a low vacuum state, the signal control circuit 21 selects all of the reflected electron detection elements. In a high vacuum state, the operation flow proceeds to step S603. In step S603, the computer confirms the distance between the sample 9 and the reflected electron detector 18 along the irradiation axis of the electron beam 3. When the distance is long (FIG. 4), the signal control circuit 21 selects all of the reflected electron detection elements. When the distance is short (FIG. 3), the signal control circuit 21 selects the reflected electron detection element disposed far away from the electron beam 3.

In the operation flows of FIGS. 7 and 8, an example threshold value (steps S502 and S602) for determining whether a sample chamber is in a high vacuum state is illustrated. For example, this value can be stored in advance in a storage device included in any functional unit (e.g., the computer 11 or the signal control circuit 21) of the charged particle beam device or can be set by a user via the computer 11. The same applies to the threshold value (steps S503 and S603) for determining whether the distance between the sample 9 and the reflected electron detector is long.

FIGS. 7 and 8 illustrate, respectively, one example operational flow where a compositional image is acquired and one example operational flow where an unevenness image is acquired. However, depending on the size of the reflected electron detection element and a method of separating the reflected electron detection elements, an operation flow different from the operation flows of FIGS. 7 and 8 can be used. For example, when the reflected electron detection element is sufficiently large, a reflected electron detection element close to the electron beam 3 and a reflected electron detection element far away from the electron beam 3 can be separated when they are used. Even in a low vacuum state of several Pa, a compositional image and an unevenness image can be selectively acquired.

In the UI illustrated in FIG. 5, there can be a situation where when the composition button 301 is pressed, the distance between the sample 9 and the reflected electron detector 18 is long, and a clear compositional image cannot be acquired. In such a situation, the computer 11 can assist an operator's operation by displaying, on the display device 22, a message prompting shortening of the distance or by automatically shortening the distance.

First Embodiment: Summary

As describe above, the charged particle beam device according to the first embodiment selects all of the reflected electron detection elements when the sample chamber is in a high vacuum state and the distance between the sample 9 and the reflected electron detector 18 is long. Thereby, using as many reflected electrons 20 as possible, an observation image can be generated.

Also, when the sample chamber is in a high vacuum state and the distance between the sample 9 and the reflected electron detector 18 is short, the charged particle beam device according to the first embodiment selects a reflected electron detection element on the inner or outer circumference side depending on whether a composition or unevenness image is to be generated. Thereby, an operator can acquire a desired observation image without trial and error while changing the distance between the sample 9 and the reflected electron detector 18.

Also, the charged particle beam device according to the first embodiment selects all of the reflected electron detection elements when the sample chamber is in a low vacuum state. Thereby, an observation image can be generated by detecting as many reflected electrons as possible even when the number of reflected electrons is small.

According to the first embodiment, by adjusting the gain of the amplifier 19, the signal control circuit 21 can select each reflected electron detection element. For example, the gain of the amplifier 19 that correspond to an unselected reflected electron detection element should be set to 0. This is not the only method of selecting a reflected electron detection element, and achievement of an equivalent operation is sufficient. For example, the signal control circuit 21 can achieve an equivalent operation can achieve an equivalent operation by instructing the computer 11 and another functional unit to delete a detection signal by an unselected reflected electron detection element.

In the first embodiment, an instance where reflected electron detection elements are formed as double concentric annular elements is illustrated. However, concentric annular elements can be tripled or more. In this case, for example, when the reflected electron detection element close to the electron beam 3 is selected in step S503, it may be configured to select the reflected electron detection element other than the reflected electron detection element disposed on the outermost circumference. Also, all of the reflected electron detection elements other than the reflected electron detection element disposed on the outmost circumference do not need to be selected. It may be configured to select at least one of the reflected electron detection elements close to the electron beam 3. The operation in step S603 is opposite of the foregoing operation. Specifically, it may be configured to select any reflected electron detection element other than the reflected electron detection element disposed on the innermost circumference. The same applies to the below-described embodiments.

Second Embodiment

In the first embodiment, an annular-shaped reflected electron detection element is illustrated as an example. In the second embodiment of the present invention, an example configuration different from the configuration of the first embodiment in terms of shape and separation method is illustrated. Since the other configurations of the second embodiment are the same as the configurations of the first embodiment, only the different configurations are mainly illustrated.

Figure 9:
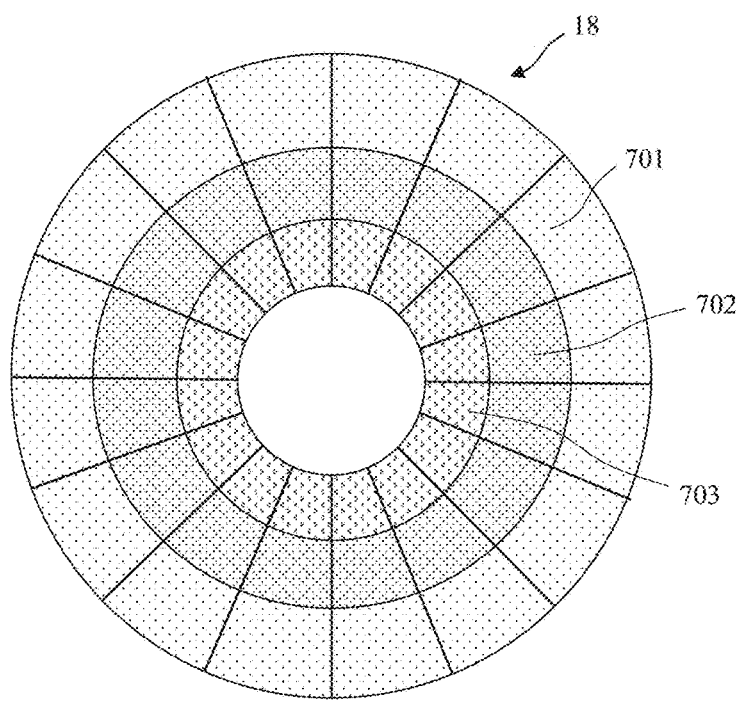
FIG. 9 is a plan diagram illustrating the reflected electron detector 18 according to a second embodiment seen from directly below.

FIG. 9 is a plan diagram illustrating the reflected electron detector 18 according to the second embodiment seen from directly below. The reflected electron detector 18 has three-layered, annularly disposed reflected electron detection elements. An outer circumference reflected electron detection element 701 is annularly disposed on the outer circumference side of the reflected electron detector 18. An inner circumference reflected electron detection element 703 is annularly disposed on the inner circumference side of the reflected electron detector 18. A middle circumference reflected electron detection element 702 is annularly disposed between the outer circumference reflected electron detection element 701 and the inner circumference reflected electron detection element 703. The reflected electron detection elements are each separated in a fan shape and connected so as to be in a concentric annular shape.

The reflected electron detection element illustrated in FIG. 9 has a large number of separate individual detection elements. It is possible to acquire, from the sample 9, various types of information considering a method of selecting a reflected electron detection element and the positional relationship between the reflected electron detector 18 and the sample 9. On the other hand, as the number of reflected electron detection elements is large, a large amount of time is taken for trial and error for selecting a reflected electron detection element and identifying the positional relationship between the reflected electron detector 18 and the sample 9 that are required for acquiring intended information.

In accordance with the method illustrated in the first embodiment, the signal control circuit 21 can, for example, select the inner circumference reflected electron detection element 703 and the middle circumference reflected electron detection element 702 in step S503 and select the outer circumference reflected electron detection element 701 in step S603. Only a certain element can be optionally selected from among of separate elements constituting a reflected electron detection element. Thereby, it is possible to accurately address the development intention of the designer who has designed the reflected electron detector 18 and automatically and effectively take advantage of the performance of the scanning electron microscope.

Third Embodiment

Figure 10:
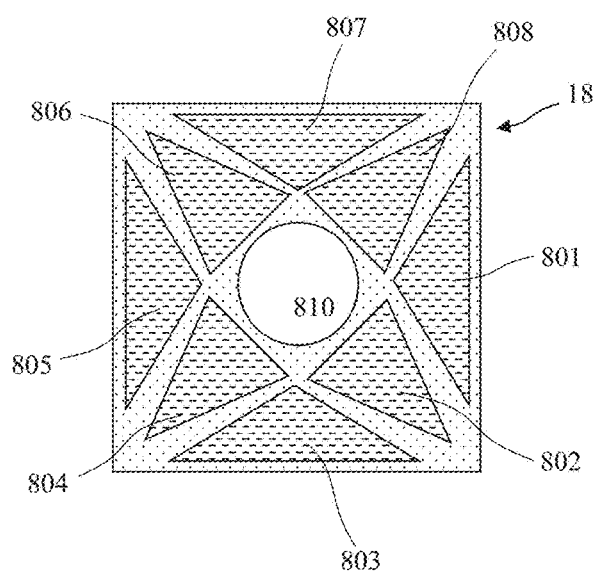
FIG. 10 is a plan diagram illustrating the reflected electron detector 18 included in a charged particle beam device according to a third embodiment seen from directly below.

FIG. 10 is a plan diagram illustrating the reflected electron detector 18 included in the charged particle beam device according to the third embodiment of the present invention seen from directly below. Unlike the first and second embodiments, the reflected electron detection elements of the reflected electron detector 18 are formed by disposing triangular elements along a concentric ring according to the third embodiment. The reflected electron detector 18 has: a hole 810, through which the electron beam 3 passes; outer circumference divergent reflected electron detection elements 801, 803, 805, 807 in a triangular shape that diverges toward the outer circumference (tapers toward the center); and outer circumference convergent reflected electron detection elements 802, 804, 806, 808 in a triangular shape that converges toward the outer circumference (tapers toward the outer circumference).

Due to their shapes, the outer circumference divergent reflected electron detection elements 801, 803, 805, 807 detect many of the reflected electrons 20 released in the direction of and far away from the electron beam 3. Accordingly, an observation image acquired using these reflected electron detection elements contain a large amount of unevenness information. On the other hand, due to their shapes, the outer circumference divergent reflected electron detection elements 802, 804, 806, 808 detect many of the reflected electrons 20 released to an area near the electron beam 3. An image acquired using these reflected electron detection elements contains a large amount of compositional information.

The reflected electron detection elements illustrated in FIG. 10 can demonstrate performance equal to the performance of the reflected electron detection elements illustrated in the first embodiment. The reflected electron detection elements according to the third embodiment have special shapes. An operator who uses these elements for the first time has to spend a large amount of time for trial and error for selecting a reflected electron detection element and identifying the positional relationship between the reflected electron detector 18 and the sample 9 that are required for acquiring an intended image. By using the method illustrated, in the first embodiment, it is possible to accurately address, in the third embodiment as well, the development intention of the designer who has designed the reflected electron detector 18 and automatically and effectively take advantage of the performance of the scanning electron microscope.

The present invention is not limited to the aforementioned embodiments, and various modified embodiments are within the scope of the present invention. The aforementioned embodiments are specifically illustrated to enhance understanding of the present invention. The present invention is not limited to embodiments that have all of the above-illustrated features. A certain feature of a certain embodiment may be substituted by a feature of another embodiment. To a feature of a certain embodiment, a feature of another embodiment may be added. Also, another feature may be added to, deleted from, or substituted with a certain feature of each embodiment.

REFERENCE SIGNS LIST

1 cathode
2 first anode
3 electron beam
4 second anode
5 conversion lens
6 objective aperture
7 deflection coil
8 objective lens
9 sample
10 electron beam control circuit
11 computer
12 sample moving device
13 sample movement control circuit
14 getter pump
15 turbo molecular pump
16 leak valve
17 exhaust control circuit
18 reflected electron detector
19 amplifier
20 reflected electron
21 signal control circuit
22 display device
23 input device
100-104 reflected electron detection element
200 large-angle reflected electron
201 small-angle reflected electron

The invention claimed is:
1. A charged particle beam device irradiating a charged particle beam to a sample, the charged particle beam device comprising:
a charged particle beam source configured to emit a charged particle beam;

a sample moving device configured to move a position of the sample;

a reflected electron detector having a plurality of detection elements configured to detect, by irradiating the charged particle beam to the sample, a reflected electron generated from the sample;

a signal control circuit configured to select, from among the plurality of detection elements that the reflected electron detector has, a detection element to be used;

a pressure meter configured to measure an atmospheric pressure inside a sample chamber where the sample is disposed; and an exhaust system configured to vacuum exhaust the inside of the sample chamber, wherein a portion of the plurality of detection elements is disposed along an annular ring;

wherein the signal control circuit is configured to select all of the detection elements in a case that the atmospheric pressure inside the sample chamber is smaller than a predetermined atmospheric pressure threshold value and a distance between the sample and the reflected electron detector along an irradiation axis of the charged particle beam is greater than or equal to a predetermined distance threshold value; and wherein the signal control circuit is configured to select at least one of the detection elements other than the detection element disposed along the annular ring on an innermost circumference side or at least one of the detection elements other than the detection element disposed along the annular ring on an outermost circumference side in a case that the atmospheric pressure inside the sample chamber is smaller than the predetermined atmospheric pressure threshold value and the distance is smaller than the predetermined distance threshold value.

2. The charged particle beam device according to claim 1, further comprising:

an operation device configured to generate an observation image of the sample using a detection signal of the reflection electron; and a user interface configured to instruct generation of a compositional image where an atomic composition of the sample is emphasized or generation of an unevenness image where an uneven shape of the sample is emphasized, wherein the signal control circuit is configured to select at least one of the detection elements other than the detection element disposed along the annular ring on the outermost circumference side in a case that an instruction to generate the compositional image is input via the user interface, and the atmospheric pressure inside the sample chamber is smaller than the predetermined atmospheric pressure threshold value and the distance is smaller than the predetermined distance threshold value; and the signal control circuit is configured to select at least one of the detection elements other than the detection element disposed along the annular ring on the innermost circumference side in a case that an instruction to generate the unevenness image is input via the user interface, and the atmospheric pressure inside the sample chamber is smaller than the predetermined atmospheric pressure threshold value and the distance is smaller than the predetermined distance threshold value.

3. The charged particle beam device according to claim 2, wherein the signal control circuit is configured to select all of the detection elements without respect to the distance in a case that the atmospheric pressure inside the sample chamber is greater than or equal to the predetermined atmospheric pressure threshold value.

4. The charged particle beam device according to claim 2, wherein the user interface comprises an input unit configured to instruct which of the detection elements is to be selected; and the signal control circuit is configured to select the detection element to be selected in accordance with the instruction in a case that the detection element to be selected is selected via the user interface.

5. The charged particle beam device according to claim 1, wherein the detection element is formed by a plurality of the fan-shaped detection elements along the annular ring.

6. The charged particle beam device according to claim 1, wherein the detection element is formed by disposing, along the annular ring, the detection elements with a tapered shape, which are tapered toward a center of the annular ring.

7. The charged particle beam device according to claim 1, wherein the detection element is formed by disposing, along the annular ring, the detection elements with a tapered shape, which are tapered from the center of the annular ring to an outer circumference.

8. A charged particle beam device irradiating a charged particle beam to a sample, the charged particle beam device comprising:

a charged particle beam source configured to emit a charged particle beam;

a sample moving device configured to move a position of the sample;

a reflected electron detector having a plurality of detection elements configured to detect, by irradiating the charged particle beam to the sample, a reflected electron generated from the sample;

a signal control circuit configured to select, from among the plurality of detection elements that the reflected electron detector has, a detection element to be used;

a pressure meter configured to measure an atmospheric pressure inside a sample chamber where the sample is disposed; and an exhaust system configured to vacuum exhaust inside the sample chamber, wherein a portion of the plurality of detection elements is disposed along an annular ring; and the signal control circuit is configured to select all of the detection elements without respect to a distance between the sample and the reflected electron detector along an irradiation axis of the charged particle beam in a case that the atmospheric pressure inside the sample chamber is greater than or equal to a predetermined atmospheric pressure threshold value.

9. The charged particle beam device according to claim 8, wherein the signal control circuit is configured to select all of the detection elements in a case that the atmospheric pressure inside of the sample chamber is smaller than the predetermined atmospheric pressure threshold value and the distance is greater than or equal to a predetermined distance threshold value; and the signal control circuit is configured to select at least one of the detection elements other than the detection element disposed along the annular ring on an innermost circumference side or at least one of the detection elements other than the detection element disposed along the annular ring on an outermost circumference side in a case that the atmospheric pressure inside the sample chamber is smaller than the predetermined atmospheric pressure threshold value and the distance is smaller than the predetermined distance threshold value.

10. The charged particle beam device according to claim 9, further comprising:
an operation device configured to generate an observation image of the sample using a detection signal of the reflection electron; and
a user interface configured to instruct generation of a compositional image where an atomic composition of the sample is emphasized or generation of an unevenness image where an uneven shape of the sample is emphasized, wherein
the signal control circuit is configured to select at least one of the detection elements other than the detection elements disposed along the annular ring on the outermost circumference side in a case that an instruction to generate the compositional image is input via the user interface, and the atmospheric pressure inside the sample chamber is smaller than the predetermined atmospheric pressure threshold value and the distance is smaller than the predetermined distance threshold value; and
the signal control circuit is configured to select at least one of the detection elements other than the detection elements disposed along the annular ring on the innermost circumference side in a case that an instruction to generate the unevenness image is input via the user interface, and the atmospheric pressure inside the sample chamber is smaller than the predetermined atmospheric pressure threshold value and the distance is smaller than the predetermined distance threshold value.

11. The charged particle beam device according to claim 10, wherein
the user interface comprises an input unit configured to instruct which of the detection elements is to be selected; and
the signal control circuit is configured to select the detection element to be selected in accordance with the instruction in a case that the detection element to be selected is selected via the user interface.

12. The charged particle beam device according to claim 8, wherein
the detection element is formed by a plurality of the fan-shaped detection elements along the annular ring.

13. The charged particle beam device according to claim 8, wherein
the detection element is formed by disposing, along the annular ring, the detection elements with a tapered shape, which are tapered toward a center of the annular ring.

14. The charged particle beam device according to claim 8, wherein
the detection element is formed by disposing, along the annular ring, the detection elements with a tapered shape, which are tapered from the center of the annular ring to an outer circumference.

15. A method of controlling a charged particle beam device irradiating a charged particle beam to a sample, the charged particle beam device including a charged particle beam source configured to emit a charged particle beam; a sample moving device configured to move a position of the sample; a reflected electron detector having a plurality of detection elements configured to detect, by irradiating the charged particle beam to the sample, a reflected electron generated from the sample; a pressure meter configured to measure an atmospheric pressure inside a sample chamber where the sample is disposed; and an exhaust system configured to vacuum exhaust the inside of the sample chamber, wherein a portion of the plurality of detection elements is disposed along an annular ring, the method comprising:
selecting, from among the plurality of detection elements that the reflected electron detector has, a detection element to be used, including
selecting all of the detection elements when the atmospheric pressure inside the sample chamber is smaller than a predetermined atmospheric pressure threshold value and a distance between the sample and the reflected electron detector along an irradiation axis of the charged particle beam is greater than or equal to a predetermined distance threshold value; and
selecting at least one of the detection elements other than the detection elements disposed along the annular ring on an innermost circumference side or at least one of the detection elements other than the detection elements disposed along the annular ring on an outermost circumference side when the atmospheric pressure inside the sample chamber is smaller than the predetermined atmospheric pressure threshold value and the distance is smaller than the predetermined distance threshold value.

16. A method of controlling a charged particle beam device irradiating a charged particle beam to a sample, the charged particle beam device including a charged particle beam source configured to emit a charged particle beam; a sample moving device configured to move a position of the sample; a reflected electron detector having a plurality of detection elements configured to detect, by irradiating the charged particle beam to the sample, a reflected electron generated from the sample; a pressure meter configured to measure an atmospheric pressure inside a sample chamber where the sample is disposed; and an exhaust system configured to vacuum exhaust the inside of the sample chamber, wherein a portion of the plurality of detection elements is disposed along an annular ring, the method comprising:
selecting, from among the detection elements that the reflected electron detector has, a detection element to be used, including
in the signal control step, selecting all of the detection elements without respect to a distance between the sample and the reflected electron detector along an irradiation axis of the charged particle beam when the atmospheric pressure inside the sample chamber is greater than or equal to a predetermined atmospheric pressure threshold value.

* * * * *